(12) United States Patent
Abe et al.

(10) Patent No.: US 9,711,976 B2
(45) Date of Patent: Jul. 18, 2017

(54) LEAD STORAGE BATTERY SYSTEM

(71) Applicant: Shin-Kobe Electric Machinery Co., Ltd., Tokyo (JP)

(72) Inventors: Keiko Abe, Tokyo (JP); Hideki Inoue, Tokyo (JP); Toshiyuki Sawa, Tokyo (JP); Masahiro Watanabe, Tokyo (JP); Hisaaki Takabayashi, Tokyo (JP); Ichiro Shimoura, Tokyo (JP); Keisuke Fukuhara, Tokyo (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 673 days.

(21) Appl. No.: 14/351,158

(22) PCT Filed: Oct. 1, 2012

(86) PCT No.: PCT/JP2012/075316
§ 371 (c)(1),
(2) Date: Apr. 11, 2014

(87) PCT Pub. No.: WO2013/054672
PCT Pub. Date: Apr. 18, 2013

(65) Prior Publication Data
US 2014/0239900 A1    Aug. 28, 2014

(30) Foreign Application Priority Data
Oct. 11, 2011  (JP) .................................. 2011-223644

(51) Int. Cl.
*H02J 7/00*    (2006.01)
*H01M 10/44*    (2006.01)
(Continued)

(52) U.S. Cl.
CPC ......... *H02J 7/0014* (2013.01); *H01M 10/441* (2013.01); *H01M 10/482* (2013.01);
(Continued)

(58) Field of Classification Search
USPC ........................................................ 320/119
See application file for complete search history.

(56) References Cited

U.S. PATENT DOCUMENTS

| 8,339,100 | B2 * | 12/2012 | Li | ........................ | H01M 10/42 |
| | | | | | 320/118 |
| 2011/0193516 | A1 * | 8/2011 | Oohara | ..................... | H02J 3/32 |
| | | | | | 320/101 |

(Continued)

FOREIGN PATENT DOCUMENTS

| JP | 2002-101565 A | 4/2002 |
| JP | 2003-259501 A | 9/2003 |

(Continued)

OTHER PUBLICATIONS

Takae Shimada et al., Modeling Method for Lead-acid Battery Simulation using Step Changing Current, IEEJ Trans. PE, 2008, vol. 28, No. 8.

*Primary Examiner* — Eric Lee
(74) *Attorney, Agent, or Firm* — Fitch, Even, Tabin & Flannery, LLP

(57) ABSTRACT

This invention reduces degradation of respective lead storage batteries making up a lead storage battery bank and extends the longevity of the lead storage batteries. A lead storage battery system includes an individual battery state measurement unit 102 that measures current, voltage, temperature etc. of individual lead storage batteries 151 or lead storage battery modules 152 making up a lead storage battery bank 101, a state-of-charge model storage unit 103 that accumulates state-of-charge models representing a correlation between the battery states and a state of charge, a state-of-charge estimation unit 104 that estimates individual states of charge of the respective lead storage batteries 151 or lead storage battery modules 152 from the state-of-charge models and the battery states, a state-of-charge variation (Continued)

range determination unit 105 that calculates a state-of-charge maximum value and a state-of-charge minimum value, and an equalization-charging management unit 109 that controls performance of an equalization charge on the lead storage battery bank 101. The equalization-charging management unit 109 performs the equalization charge so that the state-of-charge maximum value falls within a range lower than an overcharge region and the state-of-charge minimum value falls within a range higher than a sulfation region.

7 Claims, 9 Drawing Sheets

(51) Int. Cl.
*H01M 10/48* (2006.01)
*H01M 10/42* (2006.01)
*G01R 31/36* (2006.01)
*H02J 3/32* (2006.01)
*H02J 3/38* (2006.01)

(52) U.S. Cl.
CPC ....... *H01M 10/486* (2013.01); *G01R 31/3606* (2013.01); *G01R 31/3651* (2013.01); *G01R 31/3658* (2013.01); *G01R 31/3668* (2013.01); *H01M 2010/4271* (2013.01); *H02J 3/32* (2013.01); *H02J 3/386* (2013.01); *Y02E 10/763* (2013.01)

(56) References Cited

U.S. PATENT DOCUMENTS

| 2011/0196633 A1 | 8/2011 | Abe et al. |
| 2011/0288691 A1 | 11/2011 | Abe et al. |

FOREIGN PATENT DOCUMENTS

| JP | 2003-288947 A | 10/2003 |
| JP | 2004-39434 A | 2/2004 |
| JP | 2004-186087 A | 7/2004 |
| JP | 2010-159661 A | 7/2010 |
| JP | 2011-73564 A | 4/2011 |

\* cited by examiner

LEAD STORAGE BATTERY SYSTEM

TECHNICAL FIELD

This invention relates to a lead storage battery system.

BACKGROUND ART

Global warming is a serious issue for all humankind. In order to delay and stop the progress of the warming, every country is trying to promote energy savings by building smart grids and promote large-scale introduction of natural energies that do not discharge carbon dioxide, such as photovoltaic power generation and wind power generation.

The wind power generation has a merit of not discharging carbon dioxide by utilizing a natural energy; however, there are concerns about power quality degradation as an adverse effect on a power system because the output of power generation is dependent on wind conditions and accordingly unstable. For preventing such an adverse effect on the power system and effectively utilizing the energy, expectations are rising for wind power generation and storage systems using lead storage batteries or the like.

A storage battery system used to reduce fluctuations in the output of wind power generation makes the storage batteries charged and discharged to smooth the output of the wind power generation fluctuating significantly in a short period of time. This combines the outputs of the wind power generation and storage battery system, thereby supplying stable electric power to the power system.

The storage battery system is required to have a long life roughly equivalent to that of the wind power generator and to be installed at low cost.

The storage batteries used in the storage battery system are operated in a PSOC (Partial State of Charge) so as to be charged and discharged in accordance with the output fluctuations of the wind power generation. Accordingly, the storage batteries are not fully charged in a normal operation state, different from conventional storage batteries for emergencies (that are fully charged normally and discharged when needed) and industrial storage batteries (that are fully charged at night and discharged when the load is heavy in the daytime). Because of the special usage, an equalization charge (recovery charge) is regularly performed (usually once every one or two weeks) on the storage batteries to make the storage batteries fully charged.

Patent Literature 1 (PTL 1) discloses an example in which the frequency of applying equalization charges to storage batteries is changed in accordance with ambient temperature. Patent Literature 2 (PTL 2) discloses a method for preventing degradation of positive electrodes of storage batteries by setting the amount of the overcharge to a lower value (99% to 102%) than the conventional one (110% to 115%) upon performing an equalization charge on the storage batteries.

Patent Literature 3 (PTL 3) discloses a storage battery control system for wind power generation. The system assesses a relationship between an operation, and a lifetime and a degradation of storage batteries based on data collected by a storage battery operation and degradation data collection unit, makes a plan of how to operate the storage batteries to satisfy necessary lifetime requirements based on the obtained information, and operates the storage batteries in accordance with the plan.

Patent Literature 4 (PTL 4) discloses a storage battery device that estimates a present state of batteries by using multi-dimensional characteristic models in which a plurality of relational models between a terminal voltage and current measured, and a state of charge are prepared for each of degradation degrees.

Non-Patent Literature 1 (NPTL 1) discloses a method for preparing an SOC model (a discharge model) that represents a relationship between current, voltage, and temperature of a lead storage battery, and a state of (SOC) charge of the lead storage battery.

PRIOR ART DOCUMENTS

Patent Literature

PTL 1: Japanese Patent Application Laid-Open No. 2003-288947

PTL 2: Japanese Patent Application Laid-Open No. 2004-39434

PTL 3: Japanese Patent Application Laid-Open No. 2010-159661

PTL 4: Japanese Patent Application Laid-Open No. 2011-75364

Non-Patent Literature

NPTL 1: "MODELING METHOD FOR LEAD STORAGE BATTERY SIMULATION USING STEP CHANGING CURRENT" (IEEJ Transactions on Power and Energy B, Vol. 128 No. 8, 2008

SUMMARY OF INVENTION

Technical Problem

Presently, a lead storage battery system combined with a wind power generator requires an equalization charge regularly (once every two weeks). However, it has been becoming apparent that even the reduced number of times to apply an equalization charge can prevent degradation of a negative pole caused by sulfation that occurs with reduction in the state of charge (SOC).

On the other hand, unduly frequent equalization charging in order to ascertain the SOC brings about degradation of a positive electrode caused by overcharge, resulting in loss of life to the storage battery.

The inventors have so far made it possible to estimate the SOC by using the multi-dimensional characteristic models disclosed in PTL 4.

However, this SOC estimation is not satisfactory to control a lead storage battery bank in consideration of the SOC of respective lead storage batteries making up the lead storage battery bank.

The present invention is to reduce degradation of respective lead storage batteries making up a lead storage battery bank and extends a longevity of the lead storage batteries.

Solution to Problem

In the present invention, measurements of current, voltage, and temperature are performed for individual lead storage batteries or lead storage battery modules, which make up a lead storage battery bank, and estimation is made using state-of-charge models to determine maximum values and minimum values of the respective states of charge. Then, an equalization charge is performed to prevent the lead storage batteries or lead storage battery modules in the states of charge from deteriorating, thereby controlling the charge and discharge of the lead storage battery bank.

Advantageous Effects of Invention

According to the present invention, the respective lead storage batteries can be operated with less degradation, resulting in an increase in the longevity of the lead storage batteries.

In addition, the present invention can reduce the cost required for equalization charges.

Furthermore, the present invention capable of extending the life of the lead storage batteries can reduce the number of times to stop operation of the wind power generation storage system and therefore can facilitate operational management.

DESCRIPTION OF EMBODIMENTS

The present invention is directed to a storage battery system that determines a time-varying change of a state of charge (SOC) of storage batteries used in natural energy applications, such as a wind power generation system, and performs equalization charge at suitable timing in accordance with the determined SOC change to make it possible to extend the life of the storage batteries and to reduce the cost for the equalization charge and loss due to halt of the wind power generation storage system. The present invention is particularly suitable to reduce fluctuations in output from the wind power generation.

Thus, the storage battery system for reducing the wind power fluctuations is required to have a long life roughly equivalent to that of the wind power generator and to be installed at low cost.

In this description, the storage battery system is configured to include storage batteries and a controller or an equivalent which controls the operation of the storage batteries.

In the description below, lead storage batteries are used as an example of the storage batteries.

Figure 6:
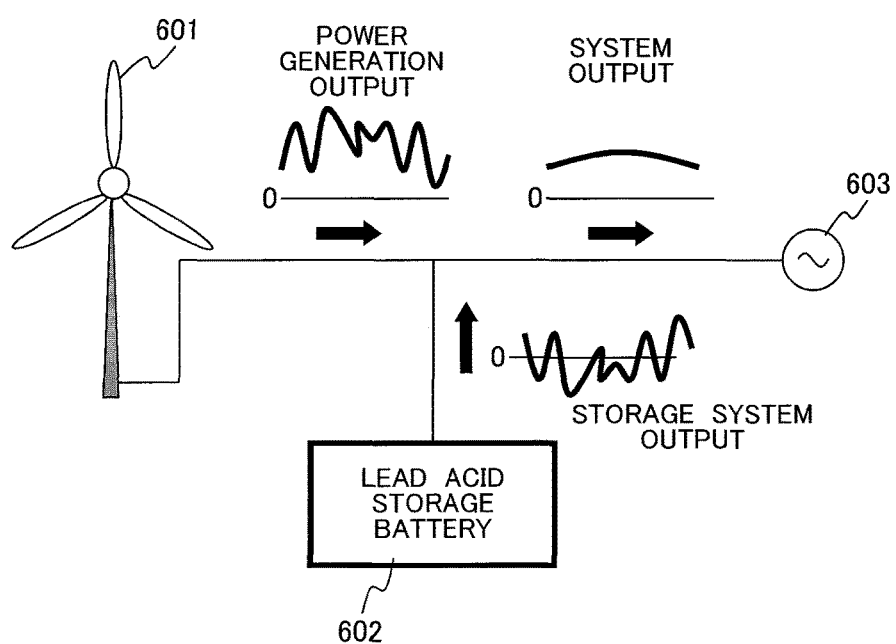
FIG. 6 is a schematic diagram illustrating a lead storage battery system combined to a wind power generator.

FIG. 6 illustrates an example of a lead storage battery system for reducing wind power fluctuations.

In FIG. 6, lead storage batteries 602 are charged or discharged in response to sharply fluctuating outputs of a wind power generator 601, and the outputs of the wind power generator 601 are combined with the outputs of the storage batteries 602 to stabilize the system output 603. This technique can supply smooth and stable electric power to the power system.

The lead storage batteries for reducing the wind power fluctuations are operated in a partial state of charge (PSOC) so as to be charged and discharged in accordance with the fluctuation in the output of the wind power generation. The storage batteries are not fully charged in a normal operation state, different from conventional storage batteries for emergencies (that are fully charged normally and discharged when needed) or industrial storage batteries (that are fully charged at night and discharged when the load is heavy in the daytime).

In such special usage, it has been thought preferable to apply an equalization charge (recovery charge) regularly (usually, once every one or two weeks) to make the lead storage batteries fully charged because of the following aims (a) and (b).

(a) To prevent degradation caused by sulfation of a negative electrode occurring when the SOC continuously remains low.

(b) To determine SOC by making the SOC 100% after application of an equalization charge.

However, it has been becoming apparent that the frequency of performing the equalization charge can be reduced to less than the currently set frequency, i.e., less than approximately once every two weeks, in order to prevent the degradation caused by the sulfation of the negative electrode. On the other hand, unduly frequent equalization charging for determining the SOC brings about degradation of a positive electrode caused by overcharge, resulting in a loss of life to the storage battery.

In addition to the aforementioned aims (a) and (b), this invention has been made in order to smooth the variations in SOC (hereinafter, referred to as "SOC variations") of respective lead storage batteries, or more specifically, to prevent the SOC of many lead storage batteries making up a lead storage battery bank from reaching a sulfation region or an overcharge region, both being regions where degradation is accelerated, even if the SOC variations increase. These aims are set to solve problems generated when the lead storage battery system is operated based on an average value of the SOC as an index without determining the SOC variations.

The problems will be described by referring to a drawing.

Figure 3:
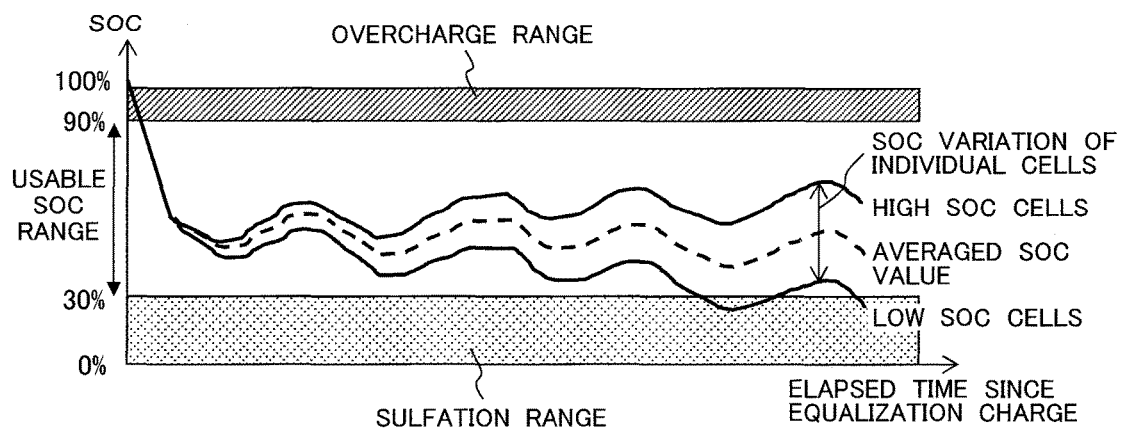
FIG. 3 is a graph showing an example of chronological change of SOC variations.

FIG. 3 is a graph showing an example of chronological change of SOC variations.

In FIG. 3, the range of the SOC in which degradation of the lead storage battery is not accelerated is assumed to be 30% to 90%. A range below 30% SOC is a region in which a sulfation-related degradation of a negative electrode is accelerated (a sulfation region), while a range over 90% SOC is a region in which an overcharge-related degradation of a positive electrode occurs (an overcharge region).

Accordingly, in FIG. 3, the upper limit of the sulfation region is 30%, and the lower limit of the overcharge region is 90%.

The SOCs of all the lead storage batteries are to be 100% immediately after an equalization charge is applied. Subsequently, the difference in SOC between a lead storage battery with a relatively high SOC and a lead storage battery with a relatively low SOC gradually increases as the lead storage batteries are repeatedly charged and discharged. If the lead storage batteries are controlled based on their average SOC value as an index, for example, the lead storage batteries (individual batteries) with a low SOC are operated within the sulfation region even though the average value of the SOC (averaged SOC) is in the usable SOC range of 30% to 90%, which is a problem.

Possible causes of the variation include subtle individual differences created during manufacture, temperature variations of the lead storage batteries generated during repetition of charge and discharge according to the installation positions, voltage and current variations of the respective lead storage batteries, electrochemical reaction variations generated in electrolyte and on electrode surfaces inside the lead storage batteries during charging and discharging.

Therefore, at present, the equalization charge is regularly applied (once every two weeks) before the thus predictable SOC variation among individual batteries increases.

However, there has been a problem that the positive electrode is deteriorated due to overcharge, and thereby the lead storage batteries suffer from reduced longevity and other risks if the equalization charge is conducted too often. In addition, frequently performed equalization charges bring about disadvantages in operation management and cost since the fluctuation of the wind power generation cannot be suppressed during the equalization charge.

Hereinafter, description will be made about a lead storage battery system according to an embodiment of the present invention.

The lead storage battery system is capable of controlling charge and discharge of a lead storage battery bank that includes a single or multiple lead storage batteries or a single or multiple lead storage battery modules connected in parallel, each of the lead storage battery module including the lead storage batteries connected in series. The lead storage battery system includes an individual battery state measurement unit that measures battery states which include current, voltage and temperature of the individual lead storage batteries or the individual lead storage battery modules; a state-of-charge model storage unit that accumulates state-of-charge models (SOC models) representing the correlation between the battery states and the state of charge (SOC); a state-of-charge estimation unit that estimates individual states of charge which are states of charge of the respective lead storage batteries or lead storage battery modules from the state-of-charge models and the battery states; a state-of-charge variation range determination unit that calculates a state-of-charge maximum value and a state-of-charge minimum value; and an equalization-charging management unit that controls performance of the equalization charge on the lead storage battery bank. The state-of-charge maximum value is the maximum value of the individual states of charge, the state-of-charge minimum value is the minimum value of the individual states of charge, and the equalization-charging management unit performs the equalization charge so that the state-of-charge maximum value falls within a range lower than the overcharge region and the state-of-charge minimum value falls within a range higher than the sulfation region.

In this description, "state-of-charge maximum value" and "state-of-charge minimum value" denote an upper end value and a lower end value, respectively, regarded as indexes in a distribution of state-of-charge values obtained from the finite number of batteries through statistic processing. Therefore, the "state-of-charge maximum value" can be defined as a maximum value of the individual states of charge and the "state-of-charge minimum value" can be defined as a minimum value of the individual states of charge, as mentioned above. In addition, the "state-of-charge maximum value" and "state-of-charge minimum value" can be set on the basis of the average value of the individual states of charge and the variation thereof, as will be described below.

In the more preferable lead storage battery system, the state-of-charge variation range determination unit calculates an average value and a variation of the individual states of charge, the state-of-charge maximum value is a sum of the average value and half of the variation, and the state-of-charge minimum value is a difference between the average value and half of the variation.

It is preferable that the lead storage battery system further includes a usable state-of-charge range adjustment unit that restricts the state-of-charge maximum value and the state-of-charge minimum value into a narrower restricted range in consideration of the influence of degradation of the lead storage batteries or the lead storage battery modules; an equalization-charging planning unit that makes a plan to perform the equalization charge when the state-of-charge maximum value and the state-of-charge minimum value go out of the restricted range; an equalization-charging schedule notification unit that notifies a schedule of the equalization charge; and an equalization-charging management unit that performs the equalization charge in accordance with the plan made by the equalization-charging planning unit.

It is preferable that the lead storage battery system further includes a state-of-charge variation display unit that displays the state-of-charge maximum value and the state-of-charge minimum value or the variation; a degradation model storage unit that stores the degree of degradation; a degradation level estimation unit that estimates a degradation level corresponding to a degree of the degradation by using the degradation model storage unit; a degradation handling state-of-charge storage unit that stores the relationship between the degradation level and the restricted range in accordance with the degradation level; and a usable state-of-charge range display unit that displays the restricted range to which the adjustment has been applied.

In the lead storage battery system, the restricted range can be between a value obtained by adding half of the difference between the state-of-charge maximum value and the state-of-charge minimum value to an upper limit value of the sulfation region and a value obtained by subtracting half of the difference between the state-of-charge maximum value and the state-of-charge minimum value from a lower limit value of the overcharge region.

In the lead storage battery system, the equalization charge may be performed at different intervals every time.

In the lead storage battery system, the interval between equalization charges changes in accordance with the variation.

It is preferable that the lead storage battery system detects individually whether the lead storage batteries or lead storage battery modules are in a state of full charge from the battery states before performing the equalization charge and opens a charging circuit of the lead storage batteries or lead storage battery modules in the state of full charge to prevent them from being overcharged. In this description, the "state of full charge" denotes a state of charge of 100%. Resultantly, this control prevents degradation of the positive electrode due to overcharge during the equalization charge.

Detailed descriptions will be provided below by referring to the drawings.

Figure 1:
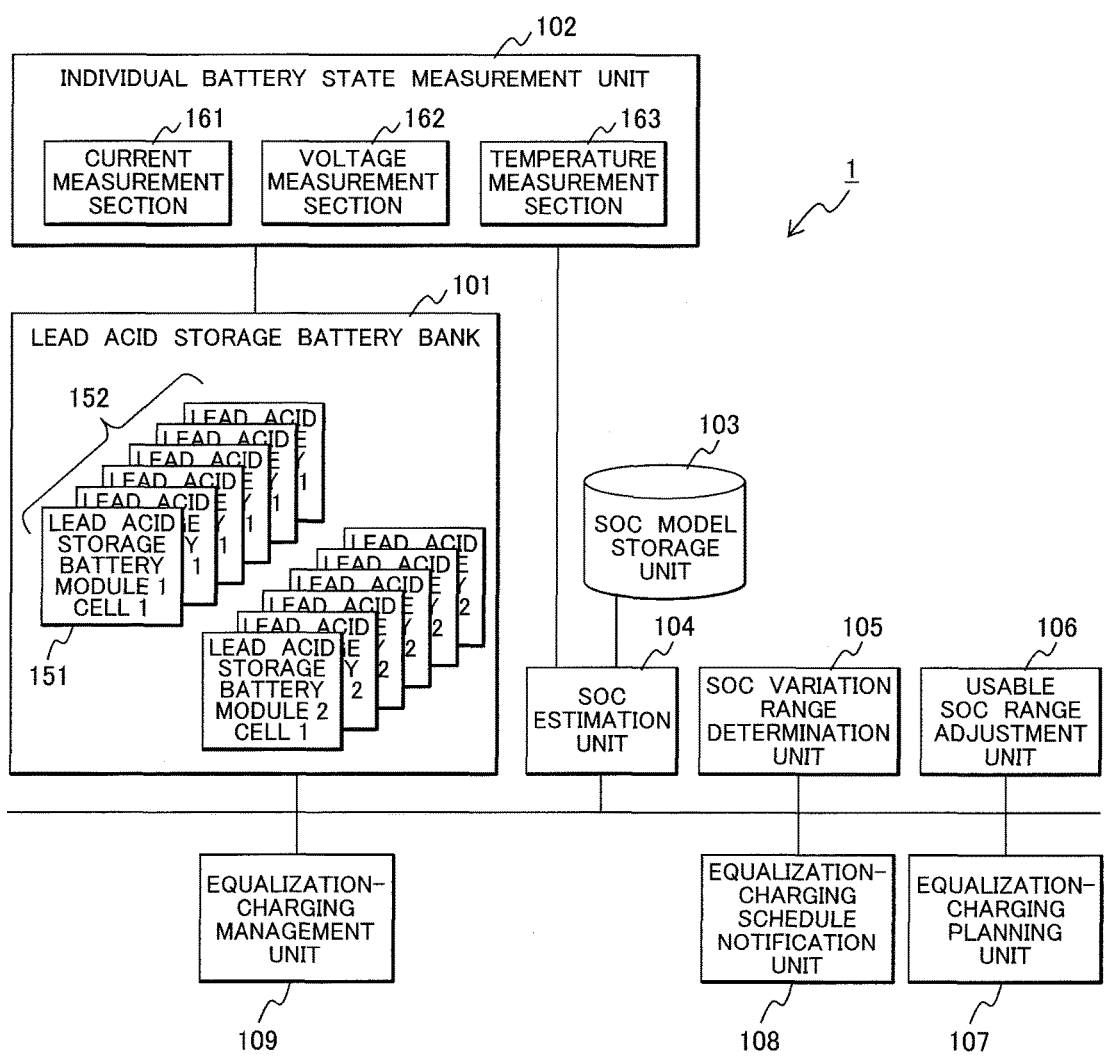
FIG. 1 is a block diagram showing a configuration of a lead storage battery system.

FIG. 1 is a block diagram showing a configuration of a lead storage battery system according to an embodiment.

A lead storage battery system 1 includes a lead storage battery bank 101, an individual battery state measurement unit 102, an SOC model storage unit 103 (a state-of-charge model storage unit), an SOC estimation unit 104 (a state-of-charge estimation unit), an SOC variation range determination unit 105 (a state-of-charge variation range determination unit), a usable SOC range adjustment unit 106 (a usable state-of-charge range adjustment unit), an equalization-charging planning unit 107, an equalization-charging schedule notification unit 108, and an equalization-charging management unit 109.

The functions of these units will be described.

The lead storage battery bank 101 includes multiple lead storage batteries connected in series or in parallel. More specifically, the lead storage battery bank 101 includes one or more lead storage battery modules 152 connected in parallel, each of the lead storage battery modules 152 including multiple lead storage batteries 151 (hereinafter, also referred to as "cells" or "batteries") connected in series. The lead storage battery bank 101 may include a single lead storage battery module 152 or a set of multiple lead storage batteries 151 connected in parallel.

The individual battery state measurement unit 102 includes a current measurement section 161, a voltage measurement section 162, and a temperature measurement section 163 to measure a state of the lead storage battery (referred to as "a battery state") which includes current (A), voltage (V) and temperature (° C.) of each of the lead storage batteries 151 (hereinafter, referred to as "an individual cell" or "an individual battery") or each of the lead storage battery modules 152 (hereinafter, referred to as "an individual cell module" or "an individual battery module") of the lead storage battery bank 101.

The SOC model storage unit 103 is a unit in which SOC models are stored. An SOC model represents a relationship between the current, voltage, temperature etc. of the lead storage batteries 151 and the state of charge (SOC) of the lead storage batteries 151. This SOC model is prepared in advance by examining the characteristics of the lead storage batteries 151.

Note that a method of preparing the SOC models is described in detail in NPLT 1 as an example, which also describes a procedure of preparing the models.

The SOC estimation unit 104 estimates the state of charge (SOC) of the individual lead storage batteries on the basis of a measurement information regarding the current (A), voltage (V), temperature (° C.) and so on of the individual cells or individual battery modules in the lead storage battery bank 101 measured by the individual battery state measurement unit 102; and an information regarding the relationship between the state of the lead storage batteries, such as the current (A), voltage (V), and temperature (° C.), and the state of charge (SOC) of the lead storage batteries, the information being stored in the SOC model storage unit 103.

Note that an estimation method of the state of charge (SOC) of the storage batteries using the SOC models is described in PTL 4 in detail.

The SOC variation range determination unit 105 calculates the SOC maximum value and SOC minimum value (state-of-charge maximum value and state-of-charge minimum value) of the lead storage battery bank 101 or lead storage battery module 152 from the SOC of the individual batteries determined by the SOC estimation unit 104. In other words, the SOC variation range determination unit 105 performs statistical processing on the SOC to ascertain how the SOC variation range has varied and the state of the variation, and also whether the variation exceeds or does not exceed a predetermined threshold.

The usable SOC range adjustment unit 106 adjusts the usable SOC range into a range in which the lead storage batteries 151 are not affected by degradation when the SOC variation is within the predetermined threshold range. In short, the usable SOC range is restricted to a narrower range (a restricted range) between the lower limit value of the overcharge region and the upper limit value of the sulfation region to address the degradation.

The equalization-charging planning unit 107 makes a plan to apply an equalization charge when the SOC variation exceeds the predetermined threshold.

In FIG. 1, the equalization-charging schedule notification unit 108 is designed to notify the schedule to apply an equalization charge. Since the conventional equalization charge is performed regularly (once every two weeks), the timing of the equalization charge is definite. However, an advance notification of a timing of a next equalization charge (an estimated timing) makes it easier for users to manage the lead storage battery system in the case where the equalization charge is conducted in accordance with the SOC variation as shown in this embodiment of the invention.

The equalization-charging management unit 109 performs an equalization charge according to the plan made by the equalization-charging planning unit 107.

In this description, the "variation" of SOCs denotes a quantitative difference in the SOCs among the multiple lead storage batteries 151 or multiple lead storage battery modules 152. The variation can be defined to be equal to the difference between the maximum value and minimum value out of all the estimated SOC values. Under this definition, the variation reaches its maximum because the number of the lead storage batteries 151 or the lead storage battery modules 152 is finite. Also, in this case, all the lead storage batteries 151 or the lead storage battery modules 152 can be prevented from reaching the sulfation region or the overcharge region.

In addition, the variation may be a difference between the upper limit value and lower limit value of an SOC tolerance determined through calculations of an average value of the SOCs. That is, the SOC variation available may be two times the average error, two times ($2\sigma$) of the standard deviation ($\sigma$), the full width at half maximum (FWHM), or the like. In this case, a lot of the lead storage batteries 151 or lead storage battery modules 152 can be prevented from reaching the sulfation region or the overcharge region.

Furthermore, the SOC variation available may be four times or six times ($4\sigma$ or $6\sigma$) the standard deviation. Using $4\sigma$ or $6\sigma$ SOC variation can prevent most of the lead storage batteries 151 or lead storage battery modules 152 from reaching the sulfation region or overcharge region.

Next, a processing flow will be described.

Figure 2:
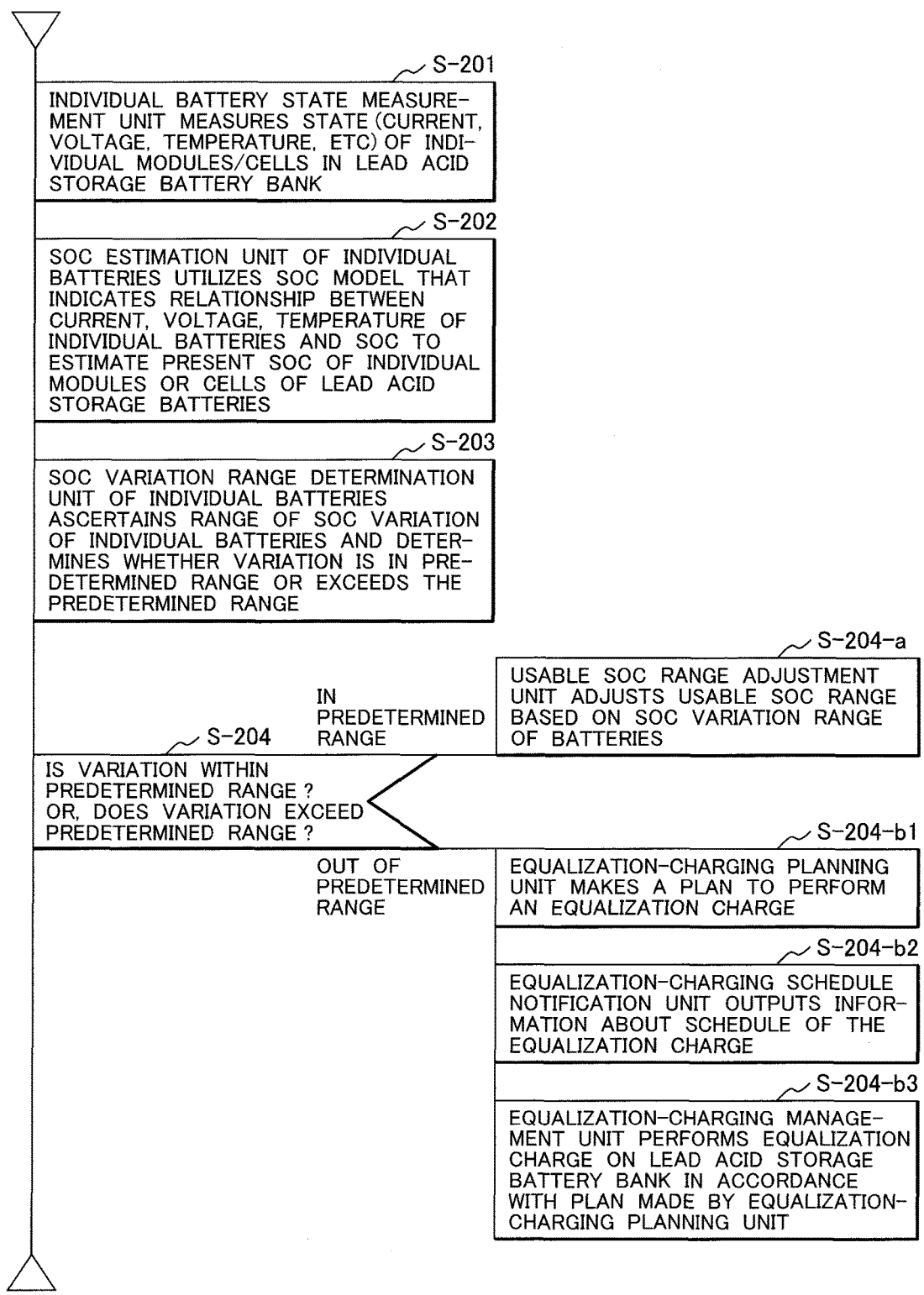
FIG. 2 is a flowchart showing processing steps performed by the lead storage battery system.

FIG. 2 is a flowchart showing processing steps performed by the lead storage battery system according to the embodiment.

First, the individual battery state measurement unit 102 measures the state (current (A), voltage (V), temperature (° C.), etc.) of individual modules or cells in a lead storage battery bank 101 (S-201).

Next, the SOC estimation unit 104 utilizes the SOC model storage unit 103 that indicates the relationship between the current, voltage, temperature of the individual lead storage batteries (also simply referred to as "batteries") and the SOC to estimate the present SOC of the individual modules or cells of the lead storage battery (S-202).

Then, the SOC variation range determination unit 105 ascertains the range of the SOC variation of the individual batteries and determines whether the variation is within a predetermined range or exceeds the predetermined range through the following steps (S-203).

Is the variation "within the predetermined range"? Does the variation "exceed the predetermined range"? Which of the ranges the variation is in? (S-204).

If the variation is "within the predetermined range", the usable SOC range adjustment unit adjusts the usable range of the SOC based on the SOC variation range of the individual batteries (S-204-a). The technique of adjusting the usable SOC range will be described later with reference to FIG. 4.

If the variation "exceeds the predetermined range", the equalization-charging planning unit 107 makes a plan to perform an equalization charge (charge timing, charging method, etc.) (S-204-b1).

Figure 10:
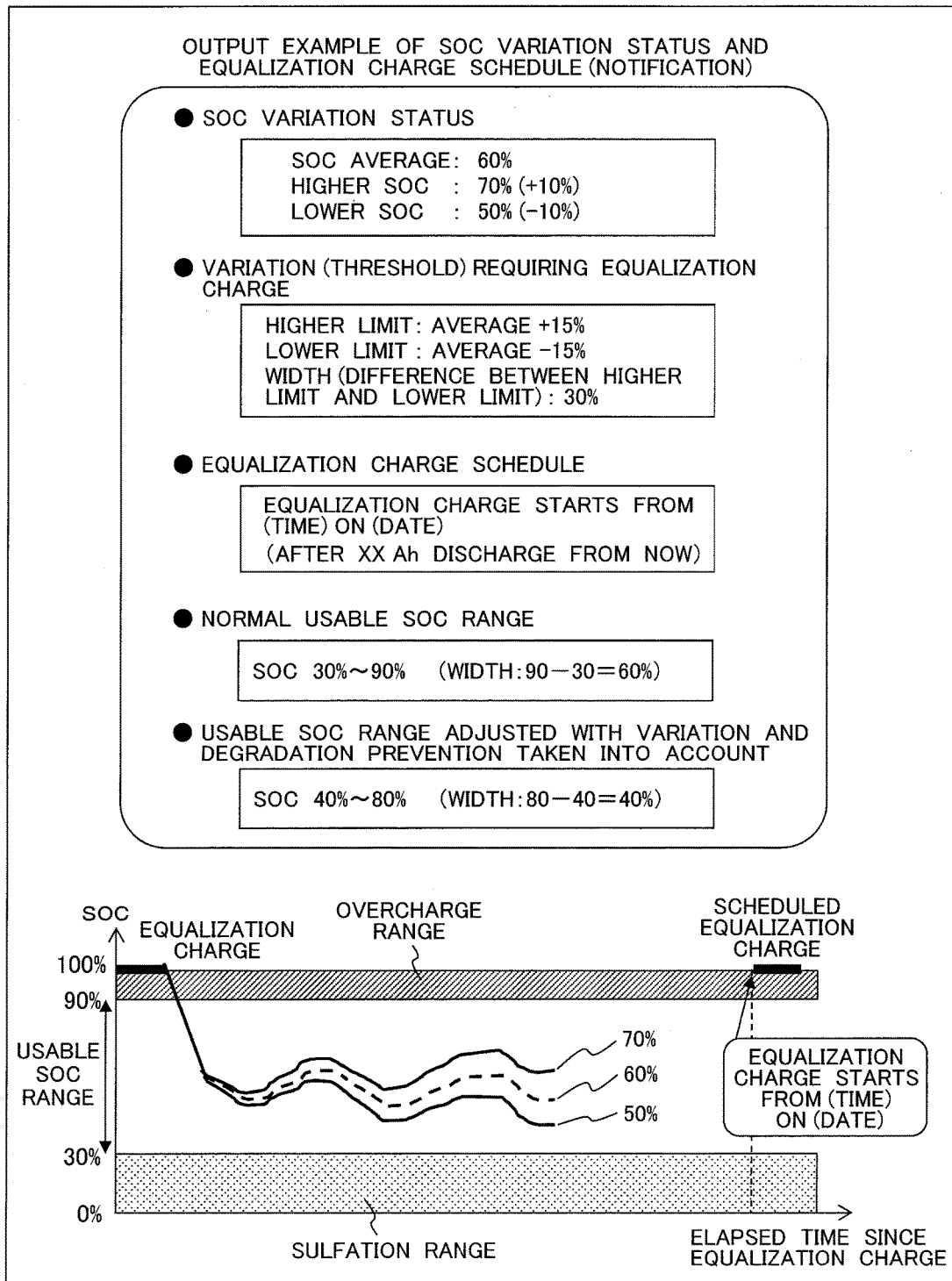
FIG. 10 is a schematic diagram of an output screen that displays a status of the SOC variations and a schedule of the equalization charge.

The equalization-charging schedule notification unit 108 outputs information about a schedule of the equalization charge (S-204-b2). An example of the information about the equalization charge schedule is indicated in FIG. 10.

The equalization-charging management unit 109 performs an equalization charge on the lead storage battery bank 101 in accordance with the plan made by the equalization-charging planning unit 107 (S-204-b3).

Through the above-described processing steps, an equalization charge can be performed at appropriate timing in accordance with the SOC variation of the individual battery cells or modules, thereby extending the life of the lead storage batteries.

Figure 4:
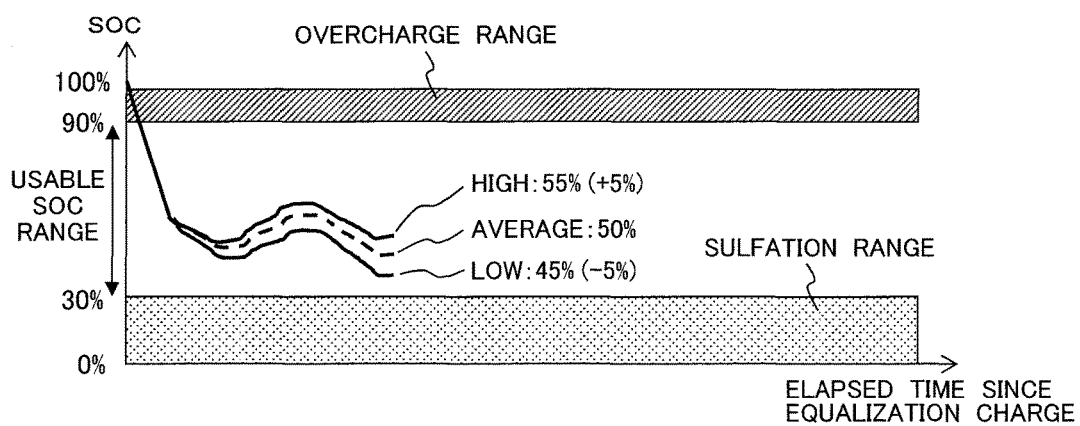
FIG. 4 is a graph showing an example of an adjusted SOC range.
Figure 5:
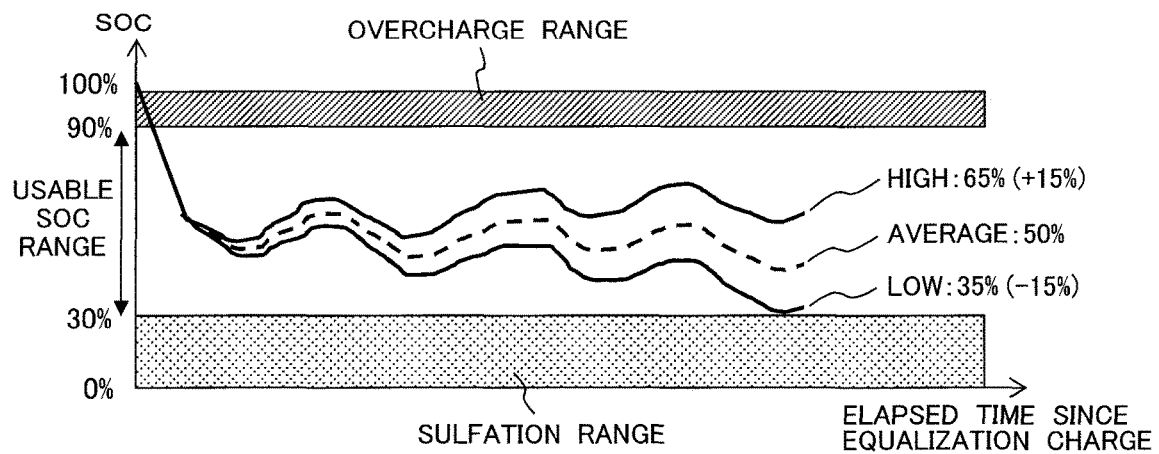
FIG. 5 is a graph showing a state in which a timing of an equalization charge is determined based on SOC variations.

With reference to FIGS. 4 and 5, exemplary adjustments of the usable SOC range will be described.

In an example shown in FIG. 4, a normal usable SOC range (a usable range of SOC where degradation is not accelerated) is from 30% SOC to 90% SOC. In other words, the usable range has a width of 60%.

As the batteries are charged and discharged repeatedly for a while after equalization charging, the SOC varies among individual batteries (each lead storage battery). In this example, the average of the SOC is 50%, the higher SOC is 55% (the average+5%), and the lower SOC is 45% (the average−5%), which shows there are SOC variations.

In this case, in order to bring the individuals (cells) in a high SOC and individuals (cells) in a low SOC into an SOC range where degradation is not accelerated, it is preferable to restrict the usable SOC range (a usable SOC range extending with respect to the SOC average value in consideration of the variations (±5%)) into 35% to 85% (a region ranging from 30+5=35% to 90−5=85%). This restricted usable SOC range is referred to as "restricted range". The restricted range in this example has a width of 50%.

In an example shown in FIG. 5, a normal usable SOC range (a usable range of SOC where degradation is not accelerated) is from 30% SOC to 90% SOC as with the case in FIG. 4.

As the batteries are charged and discharged repeatedly for a while after equalization charging, the SOC varies among individual batteries. In this example, the average of the SOC is 50%, the higher (maximum) SOC is 65% (the average+15%), and the lower (minimum) SOC is 35% (the average−15%), which shows there are increased SOC variations.

In this case, in order to bring the individuals in a high SOC and individuals in a low SOC into an SOC range where degradation is not accelerated, the restricted SOC range (a usable SOC range extending with respect to the SOC average value in consideration of the variations (±15%)) is set to from 45% to 75% (a region ranging from 30+15=45% to 90−15=75%).

Consequently, the width of the actually usable SOC range is 75−45=30%, which is half of the original width (90−30=60%). As described above, an increase in the variation narrows the SOC range of the batteries usable without accelerating the degradation. In this case, an equalization charge needs to be performed to correct the SOC variation among the individual batteries.

Next, with reference to FIGS. 7 and 8, SOC models and state-of-charge (SOC) estimation made with the SOC models will be described.

Figure 7:
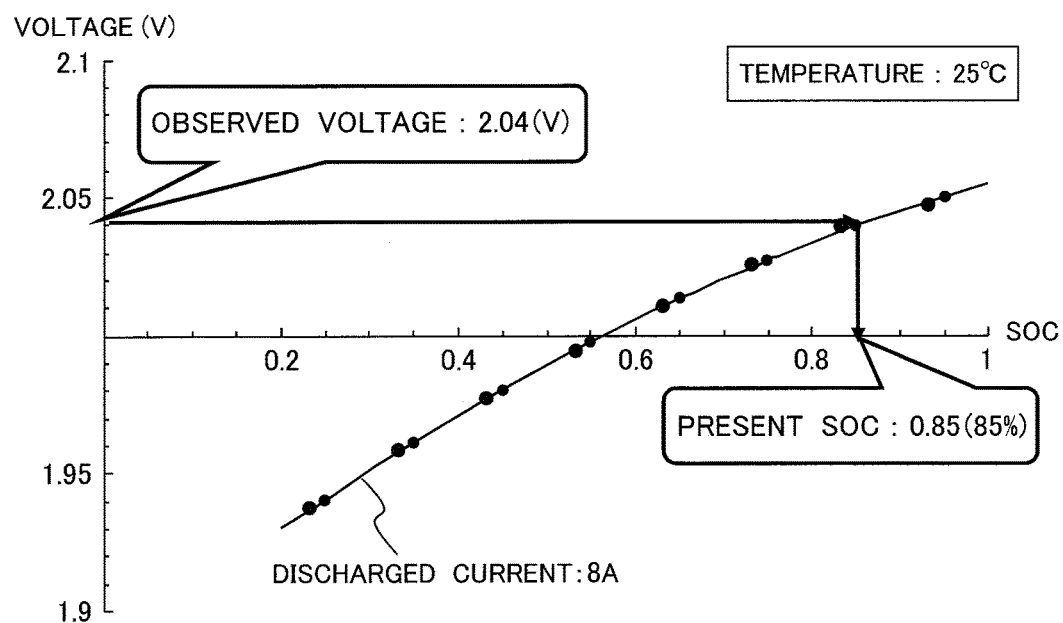
FIG. 7 is a graph showing an example of an SOC estimation using an SOC model.

FIG. 7 illustrates an example of an SOC model (discharge model) representing the relationship between voltage and SOC of a lead storage battery when the current value of the lead storage battery and ambient temperature are set constant (temperature: 25° C.; discharge current: 8 A).

Figure 8:
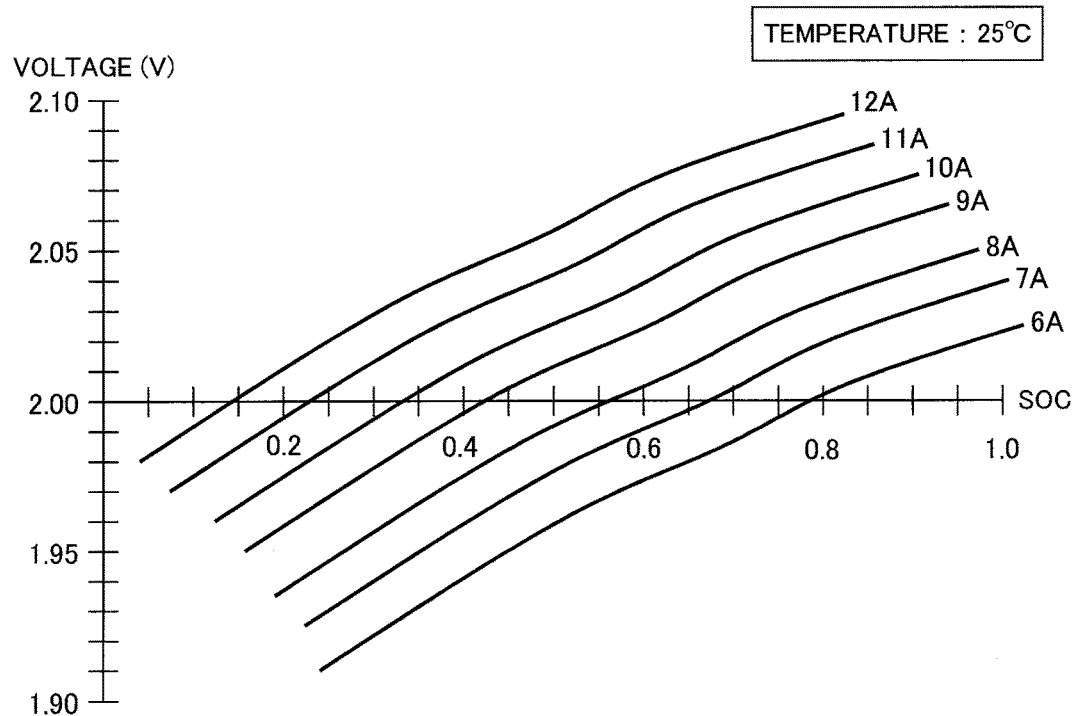
FIG. 8 is a graph showing an example of the SOC model.

FIG. 8 illustrates an example of an SOC model (discharge model) representing the relationship between voltage and SOC of a lead storage battery with current values of the lead storage battery used as a parameter when the temperature is constant.

In both FIGS. 7 and 8, the vertical axis represents voltage (V) (terminal voltage (V)), while the horizontal axis represents SOC.

For instance, as shown in FIG. 7, it is assumed that, when temperature is 25° C. and a current of 8 A is made to flow, a terminal voltage measures 2.04 (V). Under these conditions, the SOC of the lead storage battery can be assessed to be 0.85 (85%) from FIG. 7.

FIG. 7 shows only an SOC model in the case where temperature is 25° C. and the discharge current is 8 A. However, there exist multiple characteristic curves for every current value as illustrated in FIG. 8 even in the SOC model obtained at a temperature of 25° C. Furthermore, there exists an SOC model having such multiple curves for every temperature characteristic and degradation level. It is desirable that characteristic curves are further prepared for every temperature characteristic and every degradation level.

An SOC model and a method for estimating an SOC using the SOC model (FIGS. 7 and 8) are described in PTL 4 in detail. NPTL 1 describes a method for preparing the SOC model, in addition to a procedure of preparing an SOC model, as an example, in detail.

Figure 9:
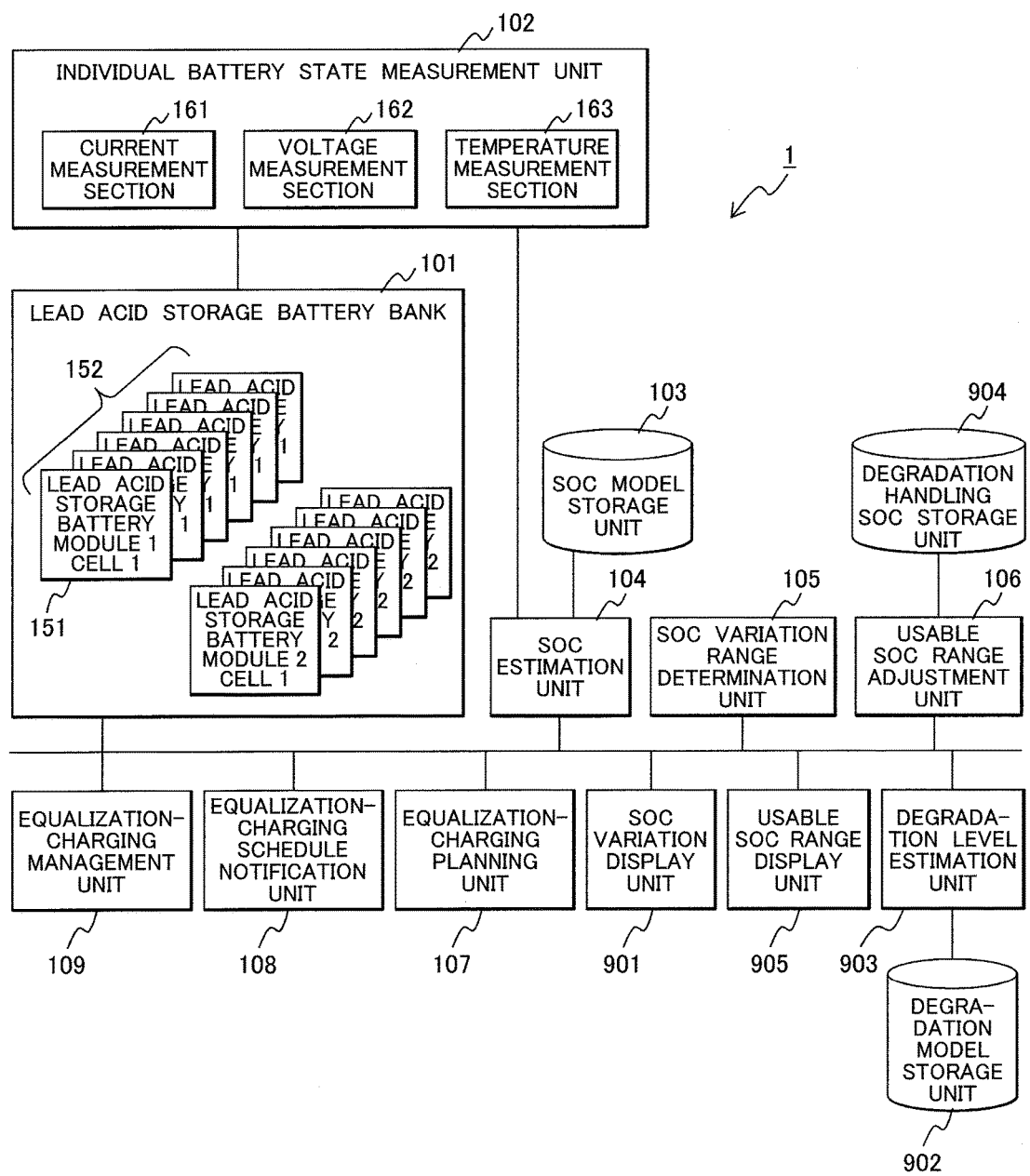
FIG. 9 is a block diagram showing another configuration of a lead storage battery system.

FIG. 9 is a block diagram showing a configuration of a lead storage battery system according to another embodiment.

In the embodiment shown in FIG. 9, changes of the usable SOC range of deteriorating lead storage batteries can be also taken into account.

FIG. 9 shows a lead storage battery bank 101, an individual battery state measurement unit 102, an SOC model storage unit 103, an SOC estimation unit 104 (a state-of-charge estimation unit), an SOC variation range determination unit 105 (a state-of-charge variation range determination unit), an SOC variation display unit 901 (a state-ofcharge variation display unit), a degradation model storage unit 902, a degradation level estimation unit 903, a degradation handling SOC storage unit 904 (a degradation handling state-of-charge storage unit: a unit of storing the relationship between degradation level and usable SOC range), a usable SOC range adjustment unit 106, a usable SOC range display unit 905 (a usable state-of-charge range display unit), an equalization-charging planning unit 107, an equalization-charging schedule notification unit 108, and an equalization-charging management unit 109.

Among these units, the functions of the units that are not shown in FIG. 1 will be mainly described.

The SOC variation display unit 901 outputs (displays, etc.) the SOC variation of individual batteries held in the SOC variation range determination unit 105 to a user or an external system.

The degradation model storage unit 902 stores models (degradation models) of the degree of degradation (degradation level) of the lead storage batteries. The degradation level estimation unit 903 estimates the degree of degradation of the lead storage batteries by using the degradation models. Various types of degradation models and various methods for estimating degradation have been devised. A typical example is a method for estimating the degradation level from the internal resistance value of the lead storage batteries. This method takes advantage of a lead storage battery's property of increasing the internal resistance as degradation progresses. In addition, the degradation model storage unit 902 and degradation level estimation unit 903 can be constructed by using a method as described in PTL 3.

FIG. 10 illustrates an exemplary screen on which a variation status of SOC (an SOC variation status) and a schedule of an equalization charge (notification) are output.

The screen in FIG. 10 displays the following items.
(1) SOC variation status
(2) Variation (threshold) requiring equalization charge
(3) Equalization charge schedule
(4) Normal usable SOC range
(5) Usable SOC range adjusted with variation and degradation prevention taken into account
(6) Graph displaying elapsed time since equalization charge, SOC variation status of individual batteries, schedule of next equalization charge, etc.

Among the items from (1) to (5), the variation (threshold) requiring an equalization charge in (2) can be appropriately set on the side of a system that reduces wind power fluctuation by using the lead storage batteries. Specifically, the variation (threshold) requiring an equalization charge can be set depending on how much extra capacity the lead storage batteries have to reduce the wind power fluctuation. For example, in a case where batteries with a capacity twice the necessary capacity are installed in anticipation of future battery degradation (capacity reduction) and other fluctuation factors, an adjustment is made to reduce the usable SOC range by half in width and an equalization charge is applied to the batteries at half the original usable SOC range.

However, the usable SOC range can be adjusted until the usable SOC range decreases by 30% if the lead storage batteries have only 30% extra capacity. Therefore, a possible method for correcting the SOC variation is to apply an equalization charge before the usable SOC range decreases by more than 30%. Even if the SOC variation deviates somewhat from the recommended usable SOC range, a short-time deviation can be made acceptable depending on the circumstances. The threshold can be determined based on the capacity (amount of extra capacity) of the batteries and the extent of how much degradation is required to be prevented (how much the deviation from the usable range is permitted).

In the screen shown in FIG. 10, the item (6) is presented in a graphical form. This graph represents the SOC variations of the individual batteries with average SOC values, higher SOC values, and lower SOC values. However, the SOC variations can be represented with the average values and standard deviation or can be represented in a general presentation method of variation status.

Figure 11:
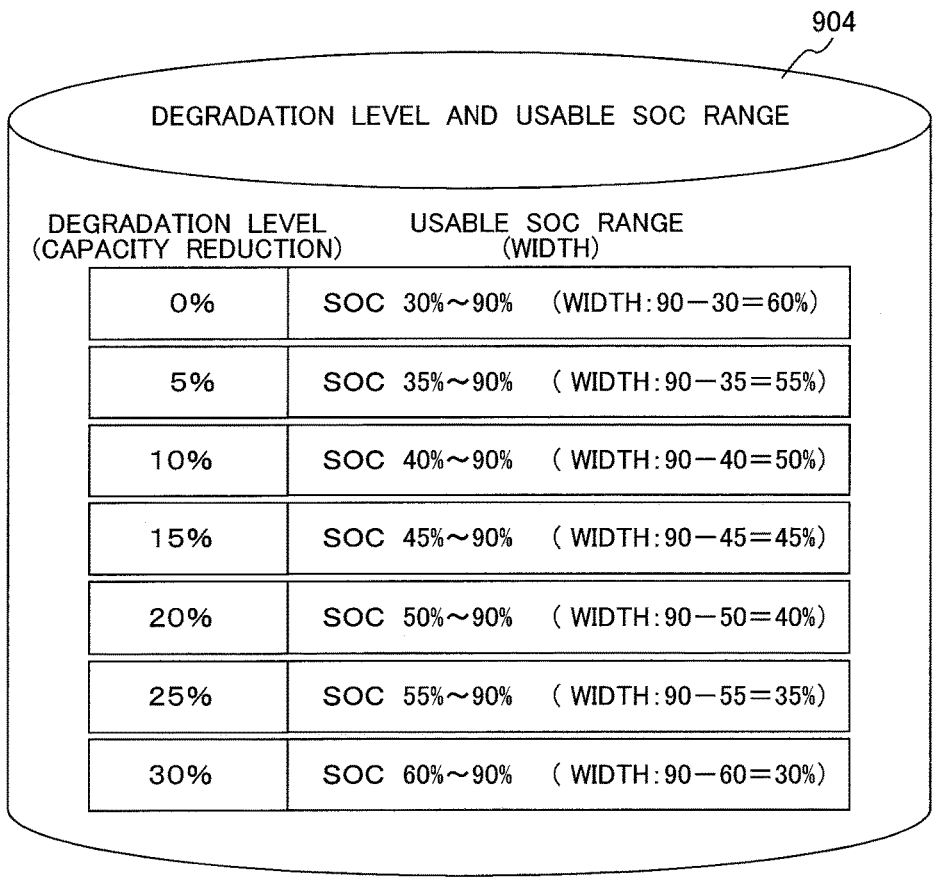
FIG. 11 illustrates an exemplary relationship between a degradation level and a usable SOC range.

FIG. 11 illustrates an example of a relationship between degradation level and usable SOC range.

"Lead storage battery is degraded" means that the capacity of the battery is reduced from the viewpoint of electrical measurement data. For example, the life of the battery sometimes is determined to end when the capacity of the battery is reduced by 30% from its rated capacity.

If lead storage batteries whose capacity has decreased are applied with an equalization charge and the SOCs after the equalization charge are defined as 100%, it appears that the usable SOC range is narrowed by raising the lower limit. For example, if the capacity of a battery is reduced by 10% with respect to the rated capacity, it can be assumed that the battery has 10% SOC (=0%+10%) to 100% SOC (recommended usable SOC range is 40% (=30%+10%) to 90%).

In consideration of the capacity reduction associated with degradation, the relationship between the degradation level and the usable SOC range (a recommended usable SOC range where degradation is not accelerated) stored in the degradation handling SOC storage unit 904 is presented as shown in FIG. 11. By defining the usable SOC range with the capacity reduction associated with degradation taken into account, the usable SOC range adjustment unit 106 can determine an appropriate usable SOC range based on the degree of the degradation of the batteries and the degree of variation among the individual batteries.

Specifically, for example, if degraded batteries whose capacity has decreased by 10% have SOC variations in which a higher SOC is the average plus 5% and a lower SOC is the average minus 5%, the usable SOC range which is adjusted so as not to accelerate battery degradation can be set to 45% (=40+5%) to 85% (=90−5%).

Although the lead storage batteries are used as an example of storage batteries in the above description, control of equalization charge over other types of storage batteries can be also made by using the same technique as long as the range of state of charge (upper limit and lower limit) of the storage batteries can be appropriately set.

Examples and a comparative example regarding operation of the lead storage battery system will be described below.

EXAMPLE 1

Figure 12:
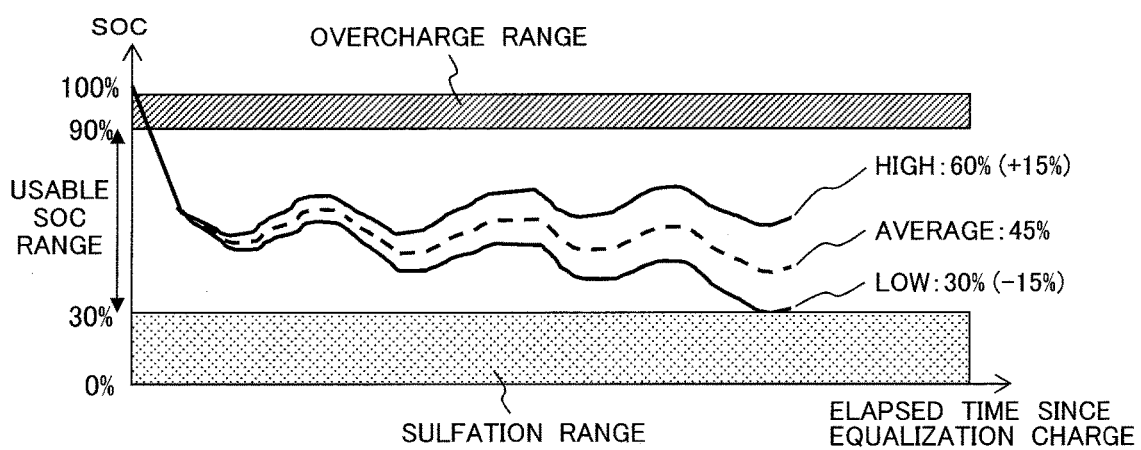
FIG. 12 is a graph showing an operational status of a lead storage battery system according to Example 1.

FIG. 12 illustrates an operation of a lead storage battery system according to an example. The horizontal axis represents a time elapsed from an application of an equalization charge, while the vertical axis represents the SOC. The usable SOC range (an SOC tolerance) is from 30% to 90%.

In FIG. 12, the next equalization charge is conducted before the lower limit of the SOC variation reaches 30%. In addition, the equalization charge can be also conducted before the upper limit of the SOC variation reaches 90%.

This allows many of the lead storage batteries to be charged without reaching the sulfation region, thereby reducing the degradation of the lead storage batteries.

EXAMPLE 2

Figure 13:
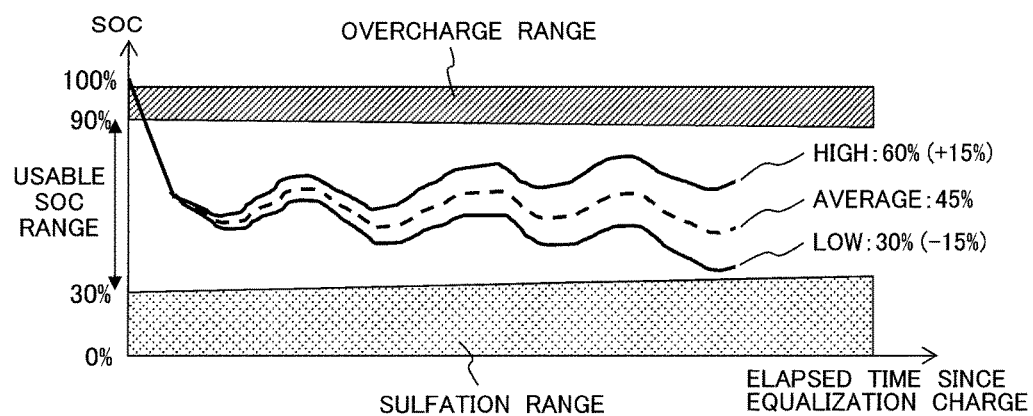
FIG. 13 is a graph showing an operational status of a lead storage battery system according to Example 2.

FIG. 13 illustrates an operation of a lead storage battery system according to an example in which the degradation level of the lead storage batteries is taken into account. The horizontal axis represents a time elapsed from an application of an equalization charge, while the vertical axis represents the SOC. The usable SOC range (the SOC tolerance) at the start of the operation is from 30% to 90%.

In FIG. 13, the lower limit of the SOC variation rises from 30% over time. On the other hand, the upper limit of the SOC variation declines from 90% over time. Even if the degradation of the lead storage batteries advances, the states of charge of the lead storage batteries are controlled so as to fall within the usable SOC range by performing the equalization charge.

This allows many of the lead storage batteries to be charged without reaching the sulfation region, thereby reducing the degradation of the lead storage batteries.

(Comparative Example)

Figure 14:
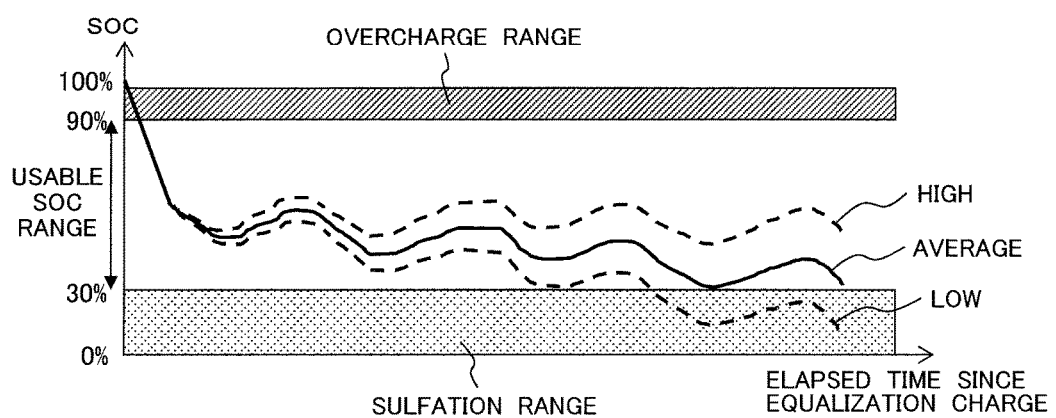
FIG. 14 is a graph showing an operational status of a lead storage battery system according to Comparative Example.

FIG. 14 illustrates an operation of a lead storage battery system according to a comparative example. The horizontal axis represents a time elapsed from an application of an equalization charge, while the vertical axis represents the SOC. The usable SOC range (the SOC tolerance) is from 30% to 90%.

In FIG. 14, the average values of the SOCs are over 30%. However, some of the lead storage batteries with an SOC lower than the average values reach 30% SOC or lower. Even if the next equalization charge is performed on the batteries in this state, about half of the lead storage batteries are likely to degrade during the repeated operations.

As described above, it is apparent that the lead storage battery system can make many of the lead storage batteries less susceptible to degradation by taking SOC variation into account.

REFERENCE SIGNS LIST

1: lead storage battery system, 101: lead storage battery bank, 102: individual battery state measurement unit, 103: SOC model storage unit, 104: SOC estimation unit, 105: SOC variation range determination unit, 106: usable SOC range adjustment unit, 107: equalization-charging planning unit, 108: equalization-charging schedule notification unit, 109: equalization-charging management unit, 151: lead storage battery, 152: lead storage battery module, 161: current measurement section, 162: voltage measurement section, 163: temperature measurement section, 901: SOC variation range display unit, 902: degradation model storage unit, 903: degradation level estimation unit, 904: degradation handling SOC storage unit, and 905: usable SOC range display unit.

The invention claimed is:

1. A lead storage battery system capable of controlling charge and discharge of a lead storage battery bank that includes a single or a plurality of lead storage batteries or a plurality of lead storage battery modules connected in parallel, each of the lead storage battery module including the lead storage batteries connected in series,
the lead storage battery state comprising;
an individual battery state measurement unit that measures battery states including current, voltage and temperature of the individual lead storage batteries or the individual lead storage battery modules;
a state-of-charge model storage unit that accumulates state-of-charge models representing a correlation between the battery state and a state of charge;
a state-of-charge estimation unit that estimates individual states of charge from the state of charge models and the battery states, the individual states of charge being state of charge of the respective lead storage batteries or lead storage battery modules;
a state-of-charge variation range determination unit that calculates a state-of-charge maximum value and a state-of-charge minimum value;
an equalization-charging management unit that controls performance of an equalization charge on the lead storage battery bank;
a usable state-of-charge range adjustment unit that restricts the state-of-charge maximum value and the state-of-charge minimum value into a narrower restricted range in consideration of an influence of degradation of the lead storage batteries or the lead storage battery modules;
an equalization-charging planning unit that makes a plan to perform the equalization charging when the state-of-charge maximum value and the state-of-charge minimum value go out of the restricted range;
an equalization-charging schedule notification unit that notifies a schedule of the equalization charge; and
an equalization-charging management unit that performs the equalization charge in accordance with the plan made the equalization-charging planning unit,
wherein the state-of-charge maximum value is a maximum value of the individual states of charge the state-of-charge minimum value is a minimum value of the individual states of charge and the equalization-charging management unit performs the equalization charge so that the state-of-charge maximum value falls within a range lower than an overcharge region and the state-of-charge minimum value falls within a range higher than a sulfation region, and
wherein the state-of-charge variation range determination unit calculates an average value and a variation of the individual states of charge, the state-of-charge maximum value is a sum of the average value and half of the variation, and the state-of-charge minimum value is a difference between the average value and half of the variation.

2. The lead storage battery system according to claim 1 further comprising;
a state-of-charge variation display unit that displays the state-of-charge maximum value and the state-of-charge minimum value or the variation;
a degradation model storage unit that stores a degree of the degradation;
a degradation level estimation unit that estimates degradation level which corresponds to the degree of the degradation by using the degradation model storage unit;
a degradation handling state-of-charge storage unit that stores a relationship between the degradation level and the restricted range in accordance with the degradation level; and
a usable state-of-charge range display unit that displays the restricted range to which the adjustment has been applied.

3. The lead storage battery system according to claim 2, wherein the restricted range extends between a value obtained by adding half of the difference between the state-of-charge maximum value and the state-of-charge minimum value to an upper limit value of the sulfation region and a value obtained by subtracting half of the difference between the state-of-charge maximum value and the state-of-charge minimum value from a lower limit value of the overcharge region.

4. The lead storage battery system according to claim 1, wherein the equalization charge is performed at different intervals every time.

5. The lead storage battery system according to claim 1, wherein the interval between equalization charges changes in accordance with the variation.

6. The lead storage battery system according to claim 1, being configured to detect individually whether the lead storage batteries or lead storage battery modules are in a state of full charge from the battery states before performing the equalization charge, and controlling to prevent the lead storage batteries or lead storage battery modules in the state of full charge from being overcharged by opening a charging circuit of them.

7. A lead storage battery system capable of controlling charge and discharge of a lead storage battery bank that includes a single or a plurality of lead storage batteries or a single or a plurality of lead storage battery modules connected in parallel, each of the lead storage battery module including the lead storage batteries connected in series, the lead storage battery system comprising;

an individual battery state measurement unit that measures battery states including current, voltage and temperature of the individual lead storage batteries or the individual lead storage battery modules;

a state-of-charge model storage unit that accumulates state-of-charge models representing a correlation between the battery state and a state of charge;

a state-of-charge estimation unit that estimates individual states of charge from the state-of-charge models and the battery states, the individual states of charge being state of charge of the respective lead storage batteries or lead storage battery modules;

a state-of-charge variation range determination unit that calculates a state-of-charge maximum value and the state-of-charge minimum value;

an equalization-charging management unit that controls performance of an equalization charge on the lead storage battery bank;

a usable state-of-charge range adjustment unit that restricts the state-of-charge maximum value and the state-of-charge minimum value into a narrower restricted range in consideration of an influence of degradation of the lead storage batteries or the lead storage battery modules;

an equalization-charging planning unit that makes a plan to perform the equalization charge when the state-of-charge maximum value and the state-of-charge minimum value go out the restricted range;

an equalization-charging schedule notification unit that notifies a schedule of the equalization charge;

an equalization-charging management unit that perform the equalization charge in accordance with the plan made by the equalization-charging planning unit;

a state-of-charge variation display unit that displays the state-of-charge maximum value and the state-of-charge minimum value or the variation;

a degradation model storage unit that stores a degree of the degradation;

a degradation level estimation unit that estimates degradation level which corresponds to the degree of the degradation by using the degradation model storage unit;

a degradation handling state-of-charge storage unit that stores a relationship between the degradation level and the restricted range un accordance with the degradation level; and a usable state-of-charge range display unit that displays the restricted range to which the adjustment has been applied, wherein the state-of-charge maximum value is a maximum value of the individual states of charge, the state-of-charge minimum value is a minimum value of the individual states of charge, and the equalization-charging management unit performs the equalization charge so that the state-of-charge maximum value falls within a range lower than an overcharge region and the state-of-charge minimum value falls within a range higher than a sulfation region, and wherein the restricted range extends between a value obtained by adding half of the difference between the state-of-charge maximum value and the state-of-charge minimum value to an upper limit value of the sulfation region and a value obtained by subtracting half of the difference between the state-of-charge maximum value and the state-of-charge minimum value from a lower limit value of the overcharge region.

* * * * *